(12) United States Patent
Rangan et al.

(10) Patent No.: US 8,779,956 B2
(45) Date of Patent: *Jul. 15, 2014

(54) SIGMA-DELTA CONVERTER SYSTEM AND METHOD

(75) Inventors: Giri NK Rangan, Bangalore (IN);
Roger Levinson, Los Gatos, CA (US);
John M. Caruso, Danville, CA (US)

(73) Assignee: Intersil Americas Inc., Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/305,607

(22) Filed: Nov. 28, 2011

(65) Prior Publication Data

US 2012/0194370 A1 Aug. 2, 2012

Related U.S. Application Data

(63) Continuation-in-part of application No. 13/081,918, filed on Apr. 7, 2011, now abandoned, which is a continuation of application No. 12/870,135, filed on Aug. 27, 2010, now abandoned, which is a continuation of application No. 11/999,256, filed on Dec. 3, 2007, now Pat. No. 7,786,912.

(60) Provisional application No. 60/872,378, filed on Dec. 1, 2006.

(51) Int. Cl.
*H03M 3/00* (2006.01)
*H03M 3/02* (2006.01)

(52) U.S. Cl.
CPC . *H03M 3/30* (2013.01); *H03M 3/02* (2013.01)
USPC ............ 341/143; 341/118; 341/120; 341/155

(58) Field of Classification Search
CPC ....... H03M 3/30; H03M 3/452; H03M 3/454;
H03M 3/43; H03M 3/424; H03M 3/438;
H03M 7/304; H03M 3/45; H03M 3/456;
H03M 7/3028; H03M 3/362; H03M 3/458;
H03M 3/484; H03M 3/49
USPC .................................. 341/143, 118, 120, 155
See application file for complete search history.

(56) References Cited

U.S. PATENT DOCUMENTS

| | | | | |
|---|---|---|---|---|
| 5,055,843 A | * | 10/1991 | Ferguson et al. | 341/143 |
| 5,329,282 A | * | 7/1994 | Jackson | 341/143 |
| 5,701,124 A | * | 12/1997 | Ichimura et al. | 341/50 |
| 5,760,722 A | * | 6/1998 | Harris et al. | 341/143 |
| 5,877,716 A | * | 3/1999 | Tagami | 341/143 |
| 5,982,316 A | | 11/1999 | Shin | |
| 6,064,326 A | * | 5/2000 | Krone et al. | 341/143 |
| 6,175,322 B1 | * | 1/2001 | Eastty et al. | 341/143 |
| 6,232,901 B1 | * | 5/2001 | Abbey | 341/143 |
| 6,373,418 B1 | | 4/2002 | Abbey | |
| 6,556,159 B1 | | 4/2003 | Fei et al. | |
| 6,570,519 B1 | * | 5/2003 | Yang | 341/143 |

(Continued)

*Primary Examiner* — Linh Nguyen (74) *Attorney, Agent, or Firm* — Graybeal Jackson LLP (57) ABSTRACT

A sigma-delta converter may include a filter coupled to a first summation circuit and a second summation circuit. A multi bit quantizer may be coupled to the second summation circuit. A single bit digital-to-analog converter (DAC) may be included that defines a feedback path between the multi-bit quantizer and the first summation circuit. A feed-forward coefficient circuit defining a feed forward path between the first summation circuit and the second summation circuit may be included.

29 Claims, 8 Drawing Sheets

(56) References Cited

U.S. PATENT DOCUMENTS

| | | | |
|---|---|---|---|
| 6,670,902 B1 | 12/2003 | Melanson et al. | |
| 6,680,682 B2 * | 1/2004 | Arnaud et al. | 341/155 |
| 6,765,520 B1 | 7/2004 | Chuang et al. | |
| 6,842,129 B1 | 1/2005 | Robinson | |
| 6,873,276 B2 | 3/2005 | Yang et al. | |
| 6,980,147 B2 * | 12/2005 | Mathis et al. | 341/155 |
| 7,148,829 B2 * | 12/2006 | Inukai | 341/139 |
| 7,221,302 B1 | 5/2007 | Melanson | |
| 7,248,193 B2 | 7/2007 | Fujimoto | |
| 7,362,252 B1 | 4/2008 | Pai | |
| 7,432,840 B2 | 10/2008 | Doerrer et al. | |
| 7,446,686 B2 | 11/2008 | Rueger et al. | |
| 7,616,142 B1 * | 11/2009 | Mai | 341/143 |
| 7,786,912 B2 * | 8/2010 | Rangan et al. | 341/143 |
| 2002/0175846 A1 * | 11/2002 | Sakimura | 341/143 |
| 2004/0108947 A1 * | 6/2004 | Yang et al. | 341/143 |
| 2005/0052300 A1 | 3/2005 | Ranganathan | |
| 2006/0071835 A1 * | 4/2006 | Inukai | 341/143 |
| 2006/0119491 A1 | 6/2006 | Gealow et al. | |
| 2006/0164272 A1 * | 7/2006 | Philips et al. | 341/143 |

* cited by examiner

SIGMA-DELTA CONVERTER SYSTEM AND METHOD

PRIORITY CLAIM

The present application is a Continuation-In-Part of copending U.S. patent application Ser. No. 13/081,918 filed Apr. 7, 2011; which application is a Continuation of U.S. application Ser. No. 12/870,135, filed on Aug. 27, 2010, now abandoned; which application is a Continuation of U.S. application Ser. No. 11/999,256, filed on Dec. 3, 2007, now U.S. Pat. No. 7,786,912, issued Aug. 31, 2010; which claims the benefit of U.S. Provisional Patent Application Ser. No. 60/872,378, filed Dec. 1, 2006, now expired; all of the foregoing applications are incorporated by reference herein in their entireties.

TECHNICAL FIELD

Analog-to-digital and digital-to-analog conversion circuits and more specifically, sigma-delta conversion circuits are disclosed.

BACKGROUND

Sigma-delta converters may use noise-shaping, for example, to move quantization noise to higher frequencies that may be outside a band of interest. The signal may be passed through a low-pass filter arrangement to remove higher frequency components. To increase a sample rate, a higher-order sigma-delta converter may properly noise-shape the signal and move quantization noise out of a selected frequency band of interest. Many sigma-delta converters, however, consume significant amounts of power, and take up significant die space, or "real estate".

SUMMARY

In an aspect, a sigma-delta converter may include a filter coupled to a first summation circuit at an input, and a second summation circuit at an output. A multi bit quantizer may be coupled to the second summation circuit. A single bit digital-to-analog converter (DAC) may be included that defines a feedback path between the multi bit quantizer and the first summation circuit. A feed-forward coefficient circuit defining a feed forward path between the first summation circuit and the second summation circuit may also be included.

In another aspect, a sigma-delta converter, may include a first summation circuit to receive an input voltage and an analog feedback voltage from a single bit digital-to-analog converter (DAC) to generate an output based upon a difference between the input voltage and the analog feedback voltage. The sigma-delta converter may also include a filter coupled to the first summation circuit and having a plurality of serially-coupled integrator stages having respective outputs, and a second summation circuit that sums the outputs from the integrator stages to provide a summed value to a quantizer coupled to the second summation circuit and to receive a feed forward value generated in response to an output from the second summation circuit.

In still another aspect, an electronic system may include a sigma-delta converter, which may further include a filter coupled to a first summation circuit at an input, and a second summation circuit at an output. The electronic system may also include a multi-bit quantizer coupled to the second summation circuit, and a single bit digital-to-analog converter (DAC) defining a feedback path between the multi-bit quantizer and the first summation circuit. A feed-forward coefficient circuit may define a feed forward path between the first summation circuit and the second summation circuit. The electronic system may further include at least one input device, at least one output device and at least one storage device.

In still yet another aspect, a method of controlling a feed forward sigma-delta converter having a multi bit quantizer and having a feed forward coefficient may include varying the value of the feed forward coefficient as a function of a gain control signal.

DETAILED DESCRIPTION

In the following description, certain details are set forth in conjunction with the various embodiments to provide a sufficient understanding. It will be appreciated that the various embodiments may be practiced without these particular details. Furthermore, it will be appreciated that the various embodiments described below do not limit the scope, and that various modifications, equivalents, and combinations of the various embodiments and components of the various embodiments are within the present contemplated scope. Embodiments that may include fewer than all the components of any of the various embodiments may also be within the scope although not expressly described in detail. Finally, although the operation of well-known components and/or processes may not be shown or described in detail, such omissions may be made to avoid unnecessarily obscuring the various embodiments.

Figure 1:
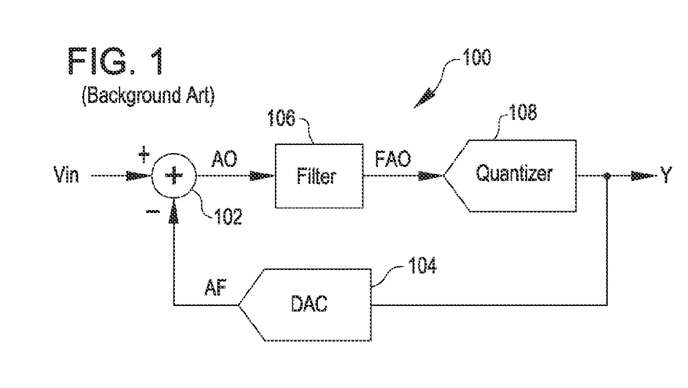
FIG. 1 is a functional block diagram of a conventional sigma-delta converter.

FIG. 1 is a functional block diagram of a conventional first-order or single-bit sigma-delta analog-to-digital (A/D) converter (ADC) 100. Briefly, and in general terms, the sigma-delta analog-to-digital (A/D) converter (ADC) 100 may be configured to convert an analog input voltage ($V_{in}$) to a corresponding digital output signal (DO). The analog input voltage $V_{in}$ may be applied to a non-inverting input of a summation circuit 102 that may also receive an analog feedback voltage (AF) from a single-bit digital-to-analog converter (DAC) 104. The DAC 104 may develop the analog feedback voltage (AF) in response to the digital output signal DO. The summation circuit 102 may subtract the analog feedback voltage AF from the input voltage $V_{in}$ to develop an analog output AO and output the analog output AO to a low pass filter 106. The low pass filter 106, which may include an integrator, may filter the analog output AO to generate a filtered analog output FAO and may apply this filtered analog output to a quantizer 108. If the converter 100 includes a single-bit circuit, the quantizer 108 may include a comparator that may compare the FAO output from the filter 106 to a reference voltage and generate the digital output signal DO in response to the comparison.

If the converter 100 includes a single-bit circuit, the converter 100 may generate a bit-stream (e.g., a series of binary values) for the digital output DO which may correspond to the analog input voltage $V_{in}$. The operation of the conventional sigma-delta converter 100 is generally understood, and for the sake of brevity, will not be described in further detail. A decimation filter (not shown in FIG. 1) typically receives the digital output DO and converts the bit-stream into a relatively slower stream of multi-bit samples, with each sample being a digital value representing a value of the analog input voltage $V_{in}$. An operational rate for the converter 100 may be indicated through a sampling frequency $F_s$ that may describe the rate at which the analog input voltage $V_{in}$ is sampled, and the rate at which the components 102-108 process samples of the analog input voltage $V_{in}$ to generate a corresponding digital output DO for each sample of the analog input voltage $V_{in}$. If the converter 100 is a multi-bit converter, the quantizer 108 may not include a single comparator, but instead, may be an analog-to-digital converter (ADC) such as a flash ADC, which may include a bank of comparators.

The converter 100 may achieve a relatively a high-resolution analog-to-digital conversion through over-sampling and noise shaping. Briefly, a system may be deemed an over-sampled system when the sampling frequency $F_s$ exceeds the minimum required sampling rate as expressed by the Nyquist sampling criteria (i.e., minimum sampling frequency must be twice the maximum frequency $F_{in}$ of the input signal $V_{in}$). For example, in an audio system, the highest audible frequency $F_{in}$ may be approximately 20 kHz so that the minimum sampling frequency (e.g., the Nyquist frequency) is approximately 40 kHz (since the minimum Fs may be equivalent to approximately $2 \times F_{in} = 2 \times 20$ kHz=40 kHz). The ratio of the sampling frequency $F_s$ to the Nyquist frequency ($F_s/2F_{in}$) may define the over-sampling ratio (OSR).

In general, quantization is a process by which a signal may be assigned or "quantized" to a selected one of a finite set of levels. Quantization may inherently introduce error. For example, if an input signal is quantized into one of N values in a quantization set and the distance between each level is Δ, the input signal may have a value exactly between two levels, and the signal therefore may have to be arbitrarily assigned to one of the two levels. By assigning the input signal to one of the two levels, an error of Δ/2 has therefore been introduced. This error may be referred to as quantization error (or quantization noise) and is statistically independent of the input signal.

If the input signal is sampled at a frequency $F_s$ so that the Nyquist sampling theorem is satisfied, the signal may now be quantized, and the power of the resulting quantization noise may be spread between zero and $F_s/2$. If the frequency band of interest extends between zero and $F_{in}$, then increasing $F_s$ may decrease the power of the noise within the band of interest. It may therefore be conveniently shown that doubling the sample frequency results in a decrease of the in-band noise power by approximately three dB. The greater the sampling frequency $F_s$, the larger the bandwidth over which this noise power may be distributed. If the sampling frequency is much greater than the frequency band of interest (for example, in a frequency band extending between zero and $F_{in}$), then the noise within the band of interest may be generally reduced, since the total noise power is distributed over a wider range of frequencies.

Using linear signal analysis, it may be shown that the filter 106 may have a low-pass characteristic with respect to the input signal $V_{in}$, and a high-pass characteristic with respect to the quantization noise. As a result, the quantization noise may be shifted or "shaped" to reside in a frequency band outside the frequency band of interest, so that this noise may later be filtered out without affecting the input signal. This technique is generally known as noise shaping. As previously mentioned, a decimation filter (not shown in FIG. 1) may receive the DO output. In addition, an additional low-pass filter (also not shown in FIG. 1) may filter out the quantization noise that has been shifted to a higher range of frequencies through noise shaping. The converter 100 may therefore achieve a high conversion resolution in the frequency band of interest (for example, in a frequency band between zero and $F_{in}$) by the use of over-sampling and noise shaping. The amount of noise power in the frequency band of interest is generally a function of the OSR (e.g., Fs/2Fin), the order of the filter 106, and the number of bits of the quantizer 108.

Because the noise power in a frequency band of interest may be a function of the number bits processed by the quantizer 108, the signal-to-noise ratio (SNR) of the converter 100 may be a function of the number of bits processed by the quantizer 108. The more bits the quantizer 108 is configured to process, the lower the quantization noise. When the quantizer 108 is configured to process multiple bits, however, the DAC 104 in the feedback path extending from the DO output to the summation circuit 102 may also include a multi-bit DAC that develops a multi-level analog feedback voltage AF.

One problem arising out of the use of a multi-bit DAC is that the analog elements used in the DAC, such as capacitive, inductive and resistive elements, may be relatively mismatched. These mismatches may cause errors among the different output levels from the DAC 104 and may result in errors in desired values for the analog feedback voltage AF. Such errors in the feedback voltage AF may result in increased signal-to-noise ratio (SNR) as well as increased total harmonic distortion (THD) of the converter 100. Increased THD may occur because the same errors may occur between the same levels for the AF output from the DAC 104 (for example, for the same values of the DO signal). As a consequence, harmonic distortion may be added to the DO signal. Since the feedback voltage AF from the DAC 104 may be applied to the summation circuit 102, any errors in this voltage may be input to the converter 100, meaning that any errors in the AF voltage from the DAC may appear at the digital output DO of the converter.

To ameliorate the effects of mismatching errors in the DAC 104, which may adversely affect the AF output and thereby the DO output, the AF output may be corrected before it is fed back in order to mitigate the resulting mismatch errors. Several conventional techniques have been utilized to compensate for such mismatch errors, and are known generally as dynamic element matching (DEM) techniques. One fundamental principle of DEM techniques is to randomize the mismatch effects of the DAC 104 such that the errors may be spread out across the frequency spectrum and thereby may appear as random noise instead of appearing as noise at discrete tones or harmonics of the input signal $V_{in}$. Various commonly utilized DEM techniques may include Data Weighted Averaging (DWA) and Individual Level Averaging (ILA). In pertinent part, each of these techniques tracks a past utilization of components in the DAC 104 to control the components selected for a current value of the AF voltage to be generated.

Some of the foregoing DEM techniques may perform well when implemented. The utilization of these techniques may result in increased design cost, as well as increased chip area occupied by the converter 100. In addition, the power consumption of the converter 100 may be increased in many of the presently-available implementations.

Figure 2:
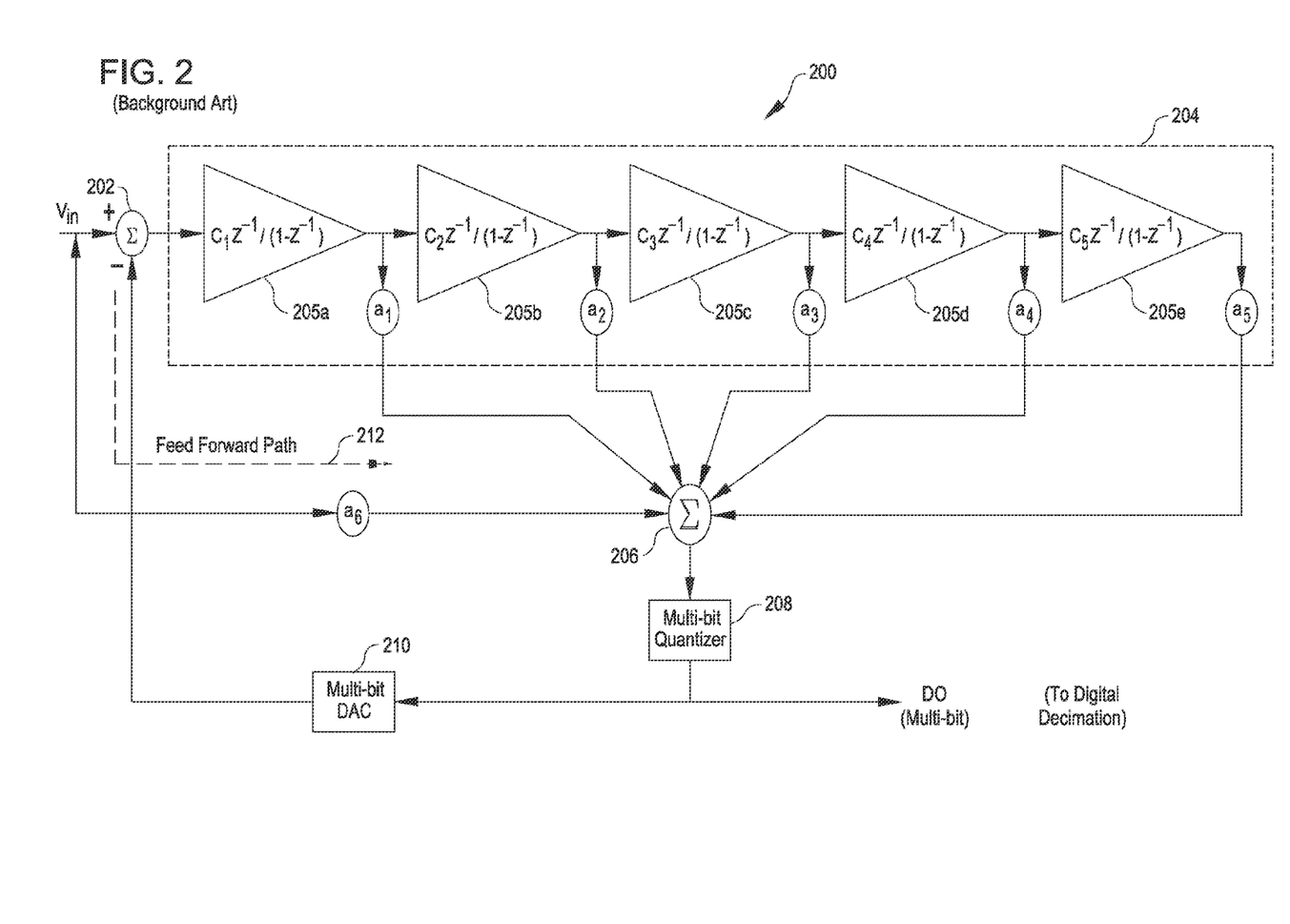
FIG. 2 is a functional block diagram of a conventional feed forward sigma-delta converter.

FIG. 2 is a functional block diagram of a feed forward sigma-delta converter 200 that receives an analog input voltage $V_{in}$ and generates a corresponding digital output voltage DO, which will be used to describe another conventional approach. The feed forward sigma-delta converter 200 may include a first summation circuit 202 coupled in series with a filter 204, a second summation circuit 206, and a multi bit quantizer 208 that may provide the digital output DO of the converter 200. A multi-bit DAC 210 may receive the DO output and may generate a corresponding feedback voltage AF that may be applied to one input of the first summation circuit 202. The input voltage $V_{in}$ may be multiplied by a coefficient $a_6$ in a feed forward path 212, and this value may be supplied as one input to the second summation circuit 206. The filter 204 may include five integrator stages 205a through 205e, and may be a $5^{th}$ order filter, as shown in FIG. 2, with an output from each stage being multiplied by corresponding coefficients $a_1$ through $a_5$ and applied as an input to the second summation circuit 206.

In operation, the feed forward path 212 may function to add a $V_{in}$ component to the input supplied to the multi-bit quantizer 208 such that this component may be supplied through the multi-bit DAC 210, and may be subtracted out by the first summation circuit 202 (since the output of DAC 210 may be applied to an inverting input of the first summation circuit 202). Accordingly, the magnitude of the input signal $V_{in}$ may be effectively cancelled out before this magnitude is communicated to the filter 204. Cancellation of the input signal $V_{in}$ enables the filter 204 to be designed to filter unwanted quantization noise, which may include both real quantization noise and harmonics introduced by the multi-bit DAC 210. This may also reduce the dynamic range of the filter 204 and may simplify its design and implementation.

Cancellation of the input signal $V_{in}$ by the converter 200 will now be described. Assuming that the multi bit quantizer 208 includes an ADC, and has a gain factor K, and that the DAC 210 has a gain factor L, the input voltage $V_{in}$ multiplied by the coefficient $a_6$ may have a value such that ($a_6 \times V_{in}$) cancels out substantially all signals from the filter 204 that may be applied to the remaining inputs of the second summation circuit 208. This may be due to the input voltage $V_{in}$ applied through summation circuit 202, the filter 204, the second summation circuit 206, the quantizer 208 and the DAC 210 experiencing a gain of KL. The value of coefficient $a_6$ is accordingly equal to $1/KL$, meaning that $a_6$ times the combined gain of the quantizer 208 and the DAC 210 (i.e., KL) is equal to approximately one. Accordingly, ($V_{in} \times a_6$) $=V_{in}/KL$ may be input to the summation circuit 206, and may experience the gain KL as it is fed back to the summation circuit 202, so that ($V_{in}/KL$)$\times K \times L$ equals $V_{in}$. If the gain of the combination of the quantizer 208 and DAC 210 (KL) is assumed to be relatively constant over the range of operation of these components, then the coefficient $a_6$ may have a relatively constant value over this range.

Note that the converter 200 may include the multi-bit DAC 210 and as previously discussed, may require the use of DEM techniques, which may incur increased design cost, increased chip area and increased power consumption problems for the converter 200.

Figure 3:
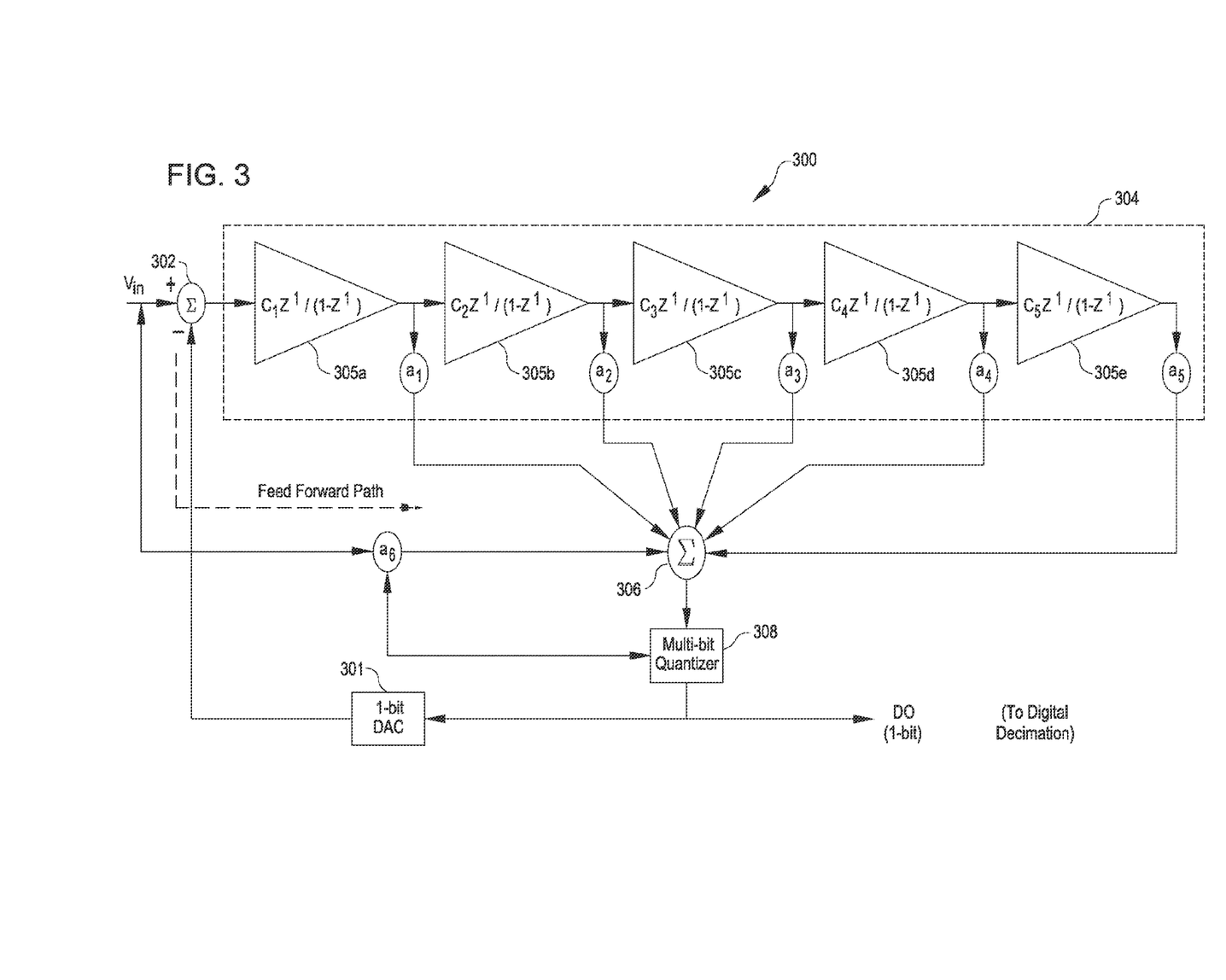
FIG. 3 is functional block diagram of multi bit sigma-delta converter including a single bit digital-to-analog converter in the feedback path according to the various embodiments.

FIG. 3 is functional block diagram of multi-bit sigma-delta converter 300 according to the various embodiments. The multi-bit sigma-delta converter 300 may include a single-bit, digital-to-analog converter (DAC) 301 in the feedback path. The use of the single-bit DAC 301 is generally smaller and therefore may consume less power at a given clock frequency (e.g., sampling frequency Fs) when compared to the multi-bit DAC 210 shown in FIG. 2. The single-bit DAC 301 may not introduce harmonic distortion, since the DAC 301 may be switching between two levels, so that differences among various levels may not exist. Accordingly, the aforementioned DEM techniques and associated circuitry and design complexity may not be required with the single element DAC 301.

The sigma-delta converter 300 may include a first summation circuit 302, filter 304, a second summation circuit 306, and a multi bit quantizer 308 that may be coupled in series between an input and an output of the converter 300. An input voltage $V_{in}$ applied at the input may be fed forward and multiplied by a coefficient $a_6$, and communicated as one input to the second summation circuit 306. The single-bit DAC 301 may receive a single bit from the multi-bit quantizer 308 that may correspond to the output of the converter 300, and may generate a feedback voltage AF that may be provided to an inverting input of the first summation circuit 302. The multi-bit output of the quantizer 308 may be utilized to generate a value for the coefficient $a_6$ in the feed forward path, as shown in FIG. 3. The filter 304 may include five integrator stages 305a through 305e, as shown in FIG. 3, although a greater number of integrator stages, or even fewer, may be used. The individual functioning of components 302-308 has been described previously in connection with FIG. 1 and FIG. 2, and therefore may not be described in further detail.

With reference still to FIG. 3, the operation of the converter 300 will now be described. The multi-bit quantizer 308 may generate a multi-bit output that may be used not in the conventional manner (as described in conjunction with FIG. 2), but instead, may be used as follows. Although the converter 300 may include the multi bit quantizer 308, only the most significant bit (MSB) of the quantizer 308 may be provided as a digital output DO of the converter 300, so that the converter 300 becomes a single-bit converter 300. Moreover, since the MSB of the value output from the quantizer 308 may be fed back to the single bit DAC 301, the MSB of the quantizer 308 provides that the effective quantizer gain is no longer well defined. The multi-bit value from the quantizer 308 may therefore be used to "linearize" the effective gain of the quantizer 308, as will be described in more detail below.

In the converter 300, the feed forward gain (e.g., the value of the coefficient $a_6$) has a value that may be determined by the value of the multi-bit output of the quantizer 308. As previously described in conjunction with FIG. 2, to cancel the input signal $V_{in}$, the feed forward gain may be equal to 1/(effective gain of quantizer 308 multiplied by the gain of feedback DAC 301). Stated differently, assuming that the gain of the DAC 301 is equal to one, the feed forward gain or value of coefficient $a_6$ may equal 1/(effective gain) of the quantizer 308. The effective gain of the quantizer 308 may now vary due to the single-bit feedback. In the converter 300, the feed forward coefficient $a_6$ may vary to track the gain of the quantizer 308 to achieve the cancellation of the input $V_{in}$. For the single-bit DAC 301, the gain is not a constant value over the entire range of the quantizer 308. Instead, the gain may be proportional to the actual quantization value from the quantizer 308, which may enable the value of the feed forward $a_6$ to be adjusted in response to the value output by the quantizer 308. Accordingly, the coefficient $a_6$ multiplied by the instantaneous combined gain of the multi-bit quantizer 308 and the single-bit DAC 301 may be approximately equal to one.

With the converter 300, the feedback DAC 301 may have only two levels and the need for DEM techniques described above may be eliminated. This may considerably reduce the chip area occupied by the converter 300 while the power consumption, when compared to the multi bit converter 200 of FIG. 2 may be significantly reduced. Increased quantization noise that may be processed or filtered by the filter 304 is no different than for the conventional single bit converter 100 (FIG. 1) and system simulation and circuit design may be used to address this noise, such as the filtering and up-shifting of the quantization noise (noise shaping), as previously described.

In the various embodiments, the quantizer 308 in the converter 300 may be a three-bit quantizer using flash ADC techniques. The three-bits from the quantizer 308 may be decoded into eight levels that may then be used to vary the value of the coefficient $a_6$. In the various embodiments, the quantizer 308 may include a symmetrical nine-level quantizer that outputs approximately equally spaced values from minus one to plus one with a step size of approximately 0.25. In the various embodiments, the feed forward coefficient $a_6$ may be varied according to the formula $a_6\_new = a_6\_default + 0.025 * d_{out}$, where $d_{out}$ may be an output of the quantizer 308. Thus, a value of plus one may result in $a_6\_new$ being approximately 0.025 higher than the previous value of $a_6$ ($a_6\_default + 0.025 \times 1$). The total variation of the coefficient $a_6$ may be approximately +/−0.025, although larger variations may also be possible in the various embodiments.

In another of the various embodiments, a value of the feed forward coefficient $a_6$ may be continuously adjusted in response to the analog voltage output from the second summation circuit 306, which may be supplied as the input of the quantizer 308. The quantizer 308 and the feedback path DAC 301 may be operated at a higher clock frequency than the filter 304. In accordance with the various embodiments, a statistical filter, which may include a Weiner filter, may be placed between the quantizer 308 and the coefficient $a_6$ (e.g., the circuit that generates the coefficient $a_6$) and may be used to extract a statistical value of an effective gain of the quantizer 308. The statistical value may be used to modify the feed forward coefficient $a_6$ and to track the gain of the quantizer 308.

Figure 4:
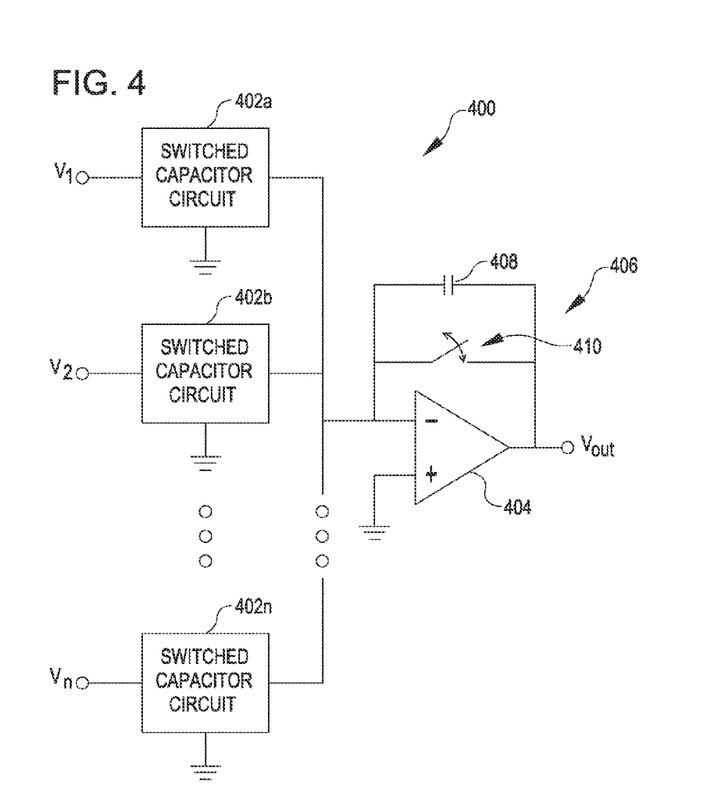
FIG. 4 is a functional block view of a summation circuit, according to the various embodiments.

FIG. 4 is a functional block view of a summation circuit 400, according to the various embodiments. With continued reference to FIG. 3, the second summation circuit 306 may be implemented using the summation circuit 400. The summation circuit 400 may include a plurality of switched capacitor circuits $402_a$ through $402_n$ configured to receive input voltages $V_a$ through $V_n$, respectively. The switched capacitor circuits $402_a$ through $402_n$ may be mutually coupled in parallel, as shown in FIG. 4. The switched capacitor circuits $402_a$ through $402_n$ will be discussed in greater detail below. The summation circuit 400 may also include an operational amplifier 404 configured to receive an input from the switched capacitor circuits $402_a$ through $402_n$ at a first input, and coupled to ground at a second output. A feedback network 406 may be coupled between the first input and an output of the operational amplifier 404. The feedback network 406 may include a feedback capacitor 408 and a feedback bi-state device 410 that may be coupled in parallel with the feedback capacitor 408. The feedback bi-state device 410 may be configured to respond to a selected logic level, as will be discussed in greater detail below.

Figure 5:
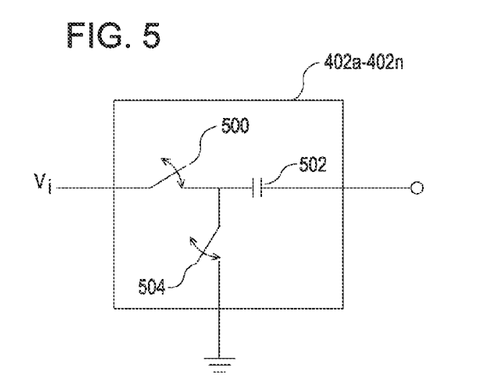
FIG. 5 is a functional block view of a switched capacitor circuit, according to the various embodiments.

With reference to FIG. 5, the switched capacitor circuit $402_a$ through $402_n$ will now be described. The switched capacitor circuit $402_a$ through $402_n$ may include a first bi-state device 500 that may be configured to selectively couple an input voltage $V_{in}$ to a capacitor 502. A second bi-state device 504 may be coupled to a ground potential and be configured to selectively couple the capacitor 502 to the ground potential. The first bi-state device 500 and the second bi-state device 504 may be further configured to be placed in a selected logic state, so that while the first bi-state device 500 is in a first logic state (e.g., in a conductive state), the second bi-state device 504 is in a second logic state that is different from the first logic state (e.g., in a non-conductive state). Conversely, when the second bi-state device 504 is the first logic state, the first bi-state device 500 is in the second logic state. The first bi-state device 500 and the second bi-state device 504 may include a bipolar transistor, a field effect transistor (FET), such as a metal oxide semiconductor field effect transistor (MOSFET), or other similar devices.

Figure 6:
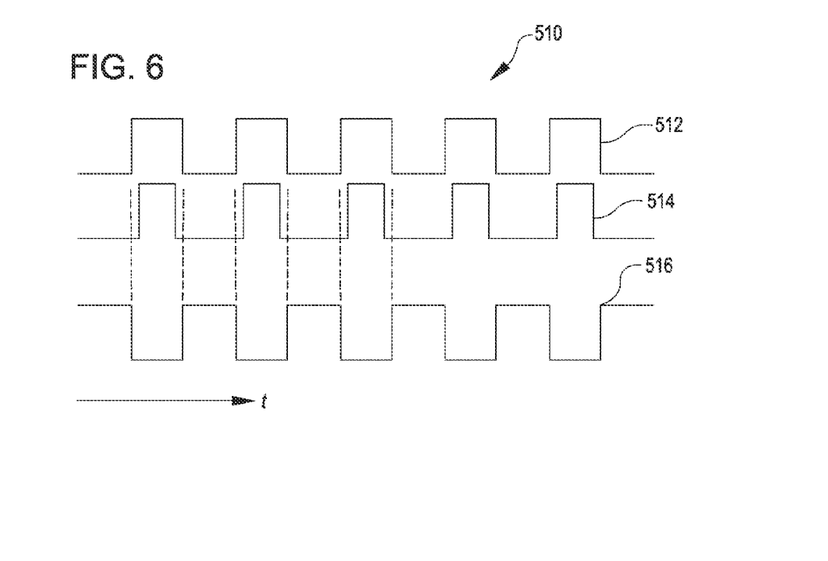
FIG. 6 is a timing diagram that describes the operation of the switched capacitor circuit of FIG. 4, in accordance with the various embodiments.

FIG. 6 is a timing diagram 510 that will be used to describe the operation of the switched capacitor circuit $402_a$ through $402_n$ in accordance with the various embodiments. A timing signal 512 may be generated by a system clock, or another similar timing device, to generate a periodic train of timing pulses. Based upon the timing signal 512, a first logic signal 514 may be generated that may exhibit phase and/or amplitude differences in comparison with the timing signal 512, as shown in FIG. 6. The first logic signal 514 may be used to actuate the first bi-state device 500 in the switched capacitor circuit $402_a$ through $402_n$. The timing signal 512 may also be used to generate a second logic signal 516 that may exhibit phase and/or amplitude differences in comparison with the timing signal 512 and the first logic signal 514, as shown in FIG. 6. Accordingly, when the first logic signal 514 is in a high logic state, the second logic signal 516 is in a low logic state. Conversely, when the first logic signal 514 is in a low logic state, the second logic signal 516 is in a high logic state.

Figure 7:
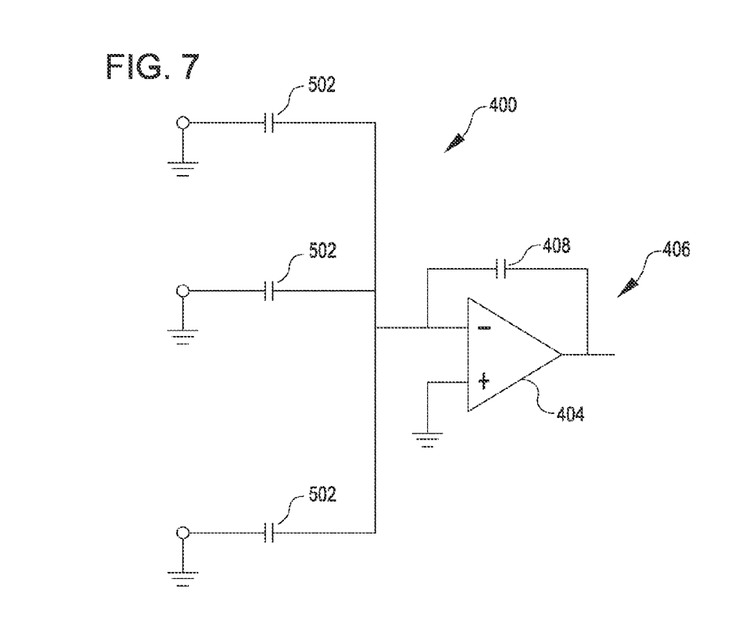
FIG. 7 is a partial schematic diagram of the summation circuit of FIG. 4, according to the various embodiments.

With reference still to FIGS. 5 and 6, FIG. 7 is a partial schematic diagram of the summation circuit 400 of FIG. 4, when the summation circuit 400 is configured according to a selected logic state. In the present case, the first bi-state device 500 (as shown in FIG. 5) is configured in a low logic state (e.g., a non-conducting state), while the second bi-state device 504 (also shown in FIG. 5) is configured in a high logic state (e.g., a conducting state). In addition, the feedback bi-state device 410 (as shown in FIG. 4) of the feedback network 406 may be configured in a low logic state, so that only the feedback capacitor 408 electrically extends between the first input and the output of the operational amplifier 404.

Figure 8:
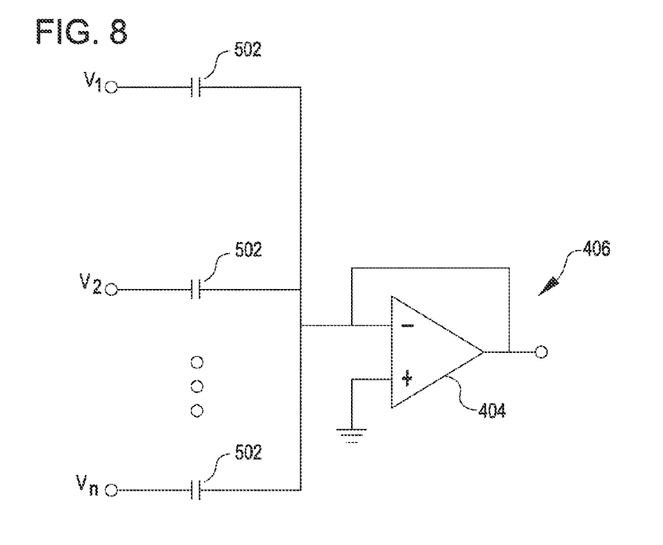
FIG. 8 is a partial schematic diagram of the summation circuit of FIG. 4, according to the various embodiments.

FIG. 8 is a partial schematic diagram of the summation circuit 400 of FIG. 4, when the summation circuit 400 is configured according to another selected logic state. In this case, the first bi-state device 500 (as shown in FIG. 5) is configured in a high logic state (e.g., a conducting state), while the second bi-state device 504 (also as shown in FIG. 5) is configured in a low logic state (e.g., a non-conducting state). The feedback bi-state device 410 (not shown in FIG. 4) of the feedback network 406 may be configured in a low logic state, so that only the feedback capacitor 408 may be electrically shorted.

Figure 9:
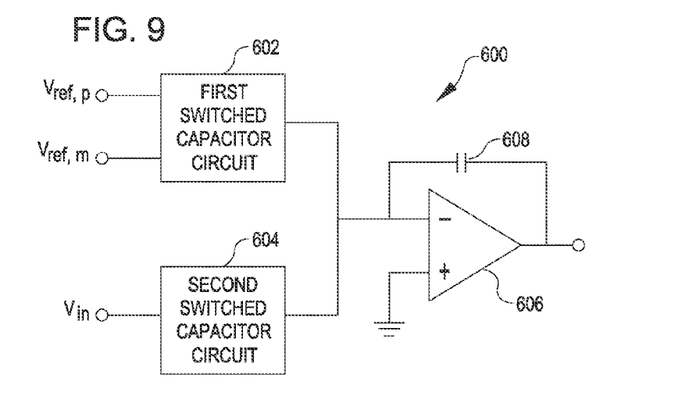
FIG. 9 is a functional block view of a summation circuit, according to the various embodiments.
Figure 10:
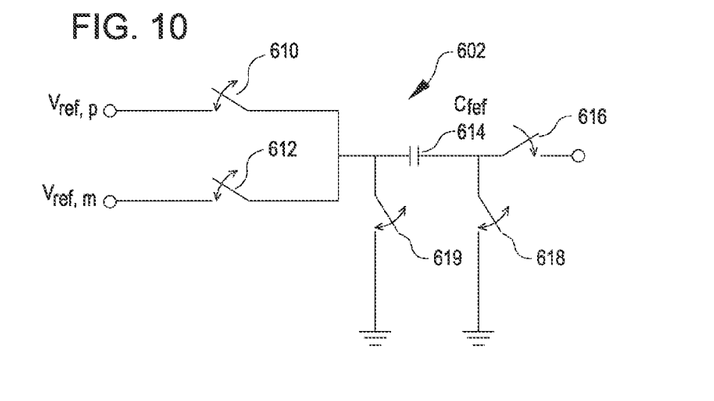
FIG. 10 is a functional block view of a first switched circuit portion of a summation circuit, according to the various embodiments.

FIG. 9 is a functional block view of a summation circuit 600, according to the various embodiments. Referring again to FIG. 3, the first summation circuit 302 may be implemented using the summation circuit 600. Briefly, the first summation circuit 302 may perform differencing between the input voltage $V_{in}$ and the feedback signal from the single-bit DAC 301. The summation circuit 600 may include a first switched capacitor circuit 602 and a second switched capacitor circuit 604 that may be coupled to a operational amplifier 606. The first switched capacitor circuit 602 and the second switched capacitor circuit 604 will be discussed in greater detail below. The summation circuit 600 may also include a feedback capacitor 608 may be coupled between a selected input and an output of the operational amplifier 606, while another of the inputs to the operational amplifier 606 may be coupled to a ground potential. The first switched circuit 602 is shown in greater detail in FIG. 10. The first switched circuit 602 may be responsive to the output of the single-bit DAC 301 (FIG. 3). Accordingly, the first switched circuit 602 may be configured to receive the voltages $V_{ref, p}$ and $V_{ref, m}$ that may correspond to selected logic levels in the feedback signal received from the single-bit DAC 301. The first switched circuit 602 may also include a first reference bi-state device 610 and a second reference bi-state device 612. The first reference bi-state device 610 and the second reference bi-state device 612 may be responsive to a logical 'AND' function of a selected one of the first logic signal 514 and the second logic signal 516. For example, the first reference bi-state device 610 and the second reference bi-state device 612 may be controlled by a logical 'AND' combination of the first logic signal 514 and a complement (or the most significant bit) of an output of the multi-bit quantizer 308 (FIG. 3). The first switched circuit 602 may also include a reference capacitor 614 that may be coupled to an output of the first switched circuit 602 through a bi-state device 616 that may be responsive to a selected one of the first logic signal 514 and the second logic signal 516. The first switched circuit 602 may also include a third reference bi-state device 618 that may be configured to intermittently couple the reference capacitor 414 to a ground potential. The third reference bi-state device 618 may be responsive to a logical 'AND' combination of the first logic signal 514 and the second logic signal 516, and a complement (or the most significant bit) of an output of the multi-bit quantizer 308 (FIG. 3). A fourth bi-state device 619 may also be coupled to the first switched circuit 602 that may be responsive to a selected one of the first logic signal 514 and the second logic signal 516.

Figure 11:
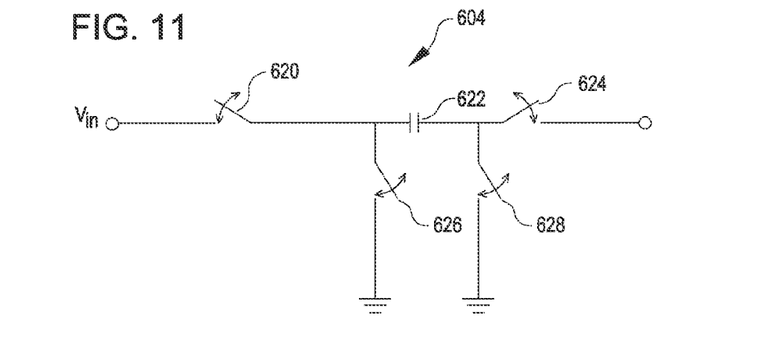
FIG. 11 is a functional block view of a second switched circuit portion of a summation circuit, according to the various embodiments.

Referring now to FIG. 11, the second switched circuit 604 will now be described. The second switched circuit 604 may include a bi-state device 620 that may be configured to respond to a selected one of the first logic signal 514 and the second logic signal 516 to intermittently couple $V_{in}$ to an input capacitor 622. An additional bi-state device 624 may couple the input capacitor 622 to an output of the second switched circuit 604. A pair of bi-state devices 626 and 628 may shunt the input capacitor 622 to a ground potential. In accordance with the various embodiments, the bi-state device 620 and the bi-state device 628 may be responsive to a selected one of the first logic signal 514 and the second logic signal 516, while the bi-state device 626 and the bi-state device 624 may be responsive to the other of the first logic signal 514 and the second logic signal 516.

Figure 12:
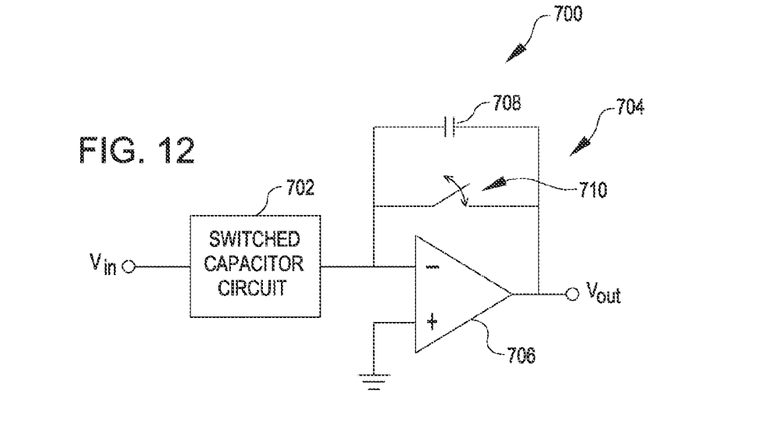
FIG. 12 is a functional block view of a feed-forward coefficient circuit, according to the various embodiments.

FIG. 12 is a functional block view of a feed-forward coefficient circuit 700, according to the various embodiments. Referring again to FIG. 3, the coefficient $a_6$ may be implemented by the feed-forward coefficient 700. The feed-forward coefficient circuit 700 may include a switched capacitor circuit 702 that may be coupled to $V_{in}$. The switched capacitor circuit 702 will be discussed in greater detail below. The feed-forward coefficient circuit 700 may also include a feedback network 704 that may be coupled to a selected input of an operational amplifier 706 and an output of the operational amplifier 706. The feedback network 704 may include a feedback capacitor 708 that may be coupled in parallel with a bi-state device 710, which may be responsive to the first logic signal 514. Referring yet again to FIG. 3, the multi bit quantizer 308 may be a multi-bit quantizer, even though the feedback to the first summation circuit 302 is single bit. Accordingly, the additional bits available from the multi-bit quantizer 308 may be used to adjust a magnitude of the coefficient $a_6$. The coefficient $a_6$ may ensure that an input to the to the filter 304 includes quantization noise, which may not include any contribution from the input voltage $V_{in}$.

Figure 13:
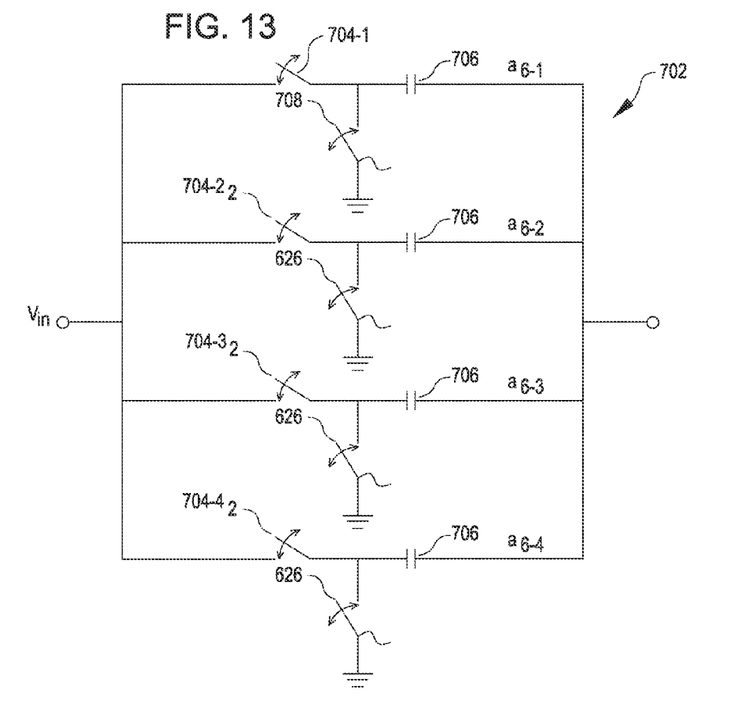
FIG. 13 is a functional block view of a switched circuit portion of a feed-forward coefficient circuit, according to the various embodiments.

Turning now to FIG. 13, the switched capacitor circuit 702 may include bi-state devices 704-1 through 704-4 that may be coupled to respective capacitors 706. The bi-state devices 704-1 through 704-4 may be actuated by signals generated by logic gates and decoding logic, such as, for example, a flash ADC that may be coupled to an output of the multi-bit quantizer 308 that may generate three output bits, wherein two of the output bits may be further received by a binary-to-thermometric decoder. Briefly, and in general terms, a thermometric code is a binary code where digit has a same place value. Accordingly, the binary-to-thermometric decoder may generate respective control signals for the bi-state devices 704-1 through 704-4. The switched capacitor circuit 702 may also include bi-state devices 708 that may be responsive to the second logic signal 516 of FIG. 6.

Figure 14:
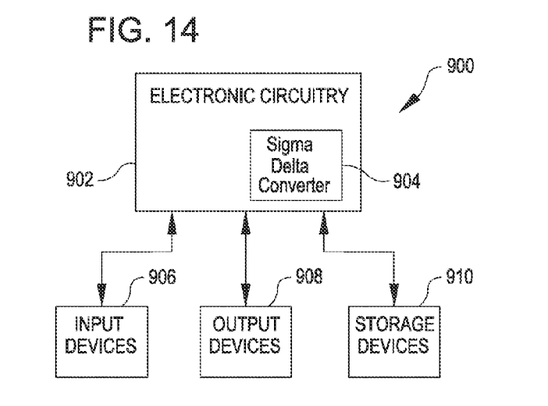
FIG. 14 is a functional block view of an electronic system including the sigma-delta converter of FIG. 3 according to another embodiment of the present invention.

FIG. 14 is a functional block diagram of an electronic system 900 that may include electronic circuitry 902 that may further include a sigma-delta converter 904, such as, for example, the sigma-delta converter 300 of FIG. 3, in accordance with the various embodiments. The electronic circuitry 902 may be generally configured to perform various computing functions, which may include, for example, executing specific instructions that may be embodied in software, or performing other specific functions, such as processing data according to the specific instructions, or by other means. The sigma-delta converter 904 may be configured to perform analog-to-digital conversion during operation of the electronic circuitry 902. The electronic system 900 may also include one or more input devices 906, which may include an audio input device (e.g., one or more microphones) or a manual input device such as a keyboard, a mouse, a tactile input device, or other similar devices, which may be coupled to the electronic circuitry 902 so that user preferences and instructions may be communicated to the electronic circuitry 902. The electronic system 900 may also include one or more output devices 908 coupled to the electronic circuitry 902. Suitable output devices may include an audio speaker, a display device, as well as other output devices that may depend on a specific function or configuration of the system 900. One or more data storage devices 910 may also be coupled to the electronic circuitry 902 to permit storage and retrieval of data or instructions from storage media, which may be located within the electronic circuitry 902, or located external to the electronic circuitry 902. Examples of suitable storage devices 910 may include magnetic storage devices, such as hard disk devices, or floppy disks, tape cassettes, or other similar devices. Other suitable storage devices 910 may include optical storage devices, such as compact disk read-only memory (CD-ROMs), compact disk read-write (CD-RW) memory devices, and digital video disks (DVDs), although other suitable alternatives exist.

It is understood that even though various embodiments and numerous details of the various embodiments have been set forth in the foregoing disclosure, it is to be regarded as illustrative only, and various changes may be made, and yet remain within the broad principles of the various embodiments. For example, certain of the components described above may be implemented using either digital or analog circuitry, or a combination of both, and also, where appropriate, may be realized in part, or even wholly through software configured to be executed on suitable processing devices. It should also be noted that various functions performed by the components in the various embodiments may be combined to be embodied in fewer elements or separated and performed by more elements. Therefore, the various embodiments may be limited only by the appended claims. Moreover, although embodiments of sigma-delta analog-to-digital converters have been disclosed, various attributes associated with the various embodiments may be applicable to digital-to-analog sigma-delta converters as well and to the extent such principles are applicable to such digital-to-analog converters these converters are within the scope of the various embodiments.

What is claimed is:

1. A sigma-delta converter, comprising:
a filter coupled to a first summation circuit at an input, and a second summation circuit at an output;
a multi bit quantizer coupled to the second summation circuit;
a single bit digital-to-analog converter (DAC) defining a feedback path between the multi bit quantizer and the first summation circuit; and
a feed-forward coefficient circuit defining a feed forward path between the first summation circuit and the second summation circuit, the feed-forward coefficient circuit operable to multiply an input voltage supplied to the first summation circuit times a coefficient and to supply the product of the input voltage times the coefficient to the second summation circuit, wherein the value of the coefficient is determined by an output of the multi bit quantizer.

2. The sigma-delta converter of claim 1, wherein the second summation circuit comprises a plurality of switched capacitor circuits configured to receive input voltages from the filter and coupled to an operational amplifier having a feedback network coupled to an output of the plurality of switched capacitor circuits.

3. The sigma-delta converter of claim 2, wherein the plurality of switched capacitor circuits each includes a first bi-state device serially coupled to a capacitor and configured to receive the input voltage, and a second bi-state device coupled to the first bi-state device and the capacitor, and coupled to a ground potential.

4. The sigma-delta converter of claim 3, wherein the first bi-state device is configurable in a high logic state and a low logic state, and the second bi-state device is configurable in a high logic state and a low logic state, such that when the first bi-state device is configured in the high logic state, the second bi-state device is configured in the low logic state, and when the second bi-state device is configured in the high logic state, the first bi-state device is configured in the low logic state.

5. The sigma-delta converter of claim 2, wherein the feedback network comprises a feedback capacitor coupled in parallel with a feedback bi-state device.

6. The sigma-delta converter of claim 5, wherein the feedback bi-state device is configurable in a high logic state and a low logic state.

7. The sigma-delta converter of claim 1, wherein the first summation circuit comprises a first switched capacitor circuit and a second switched capacitor circuit coupled to an operational amplifier having a feedback capacitor.

8. The sigma-delta converter of claim 7, wherein the first switched capacitor circuit comprises a first reference bi-state device and a second bi-state device coupled to a reference capacitor.

9. The sigma-delta converter of claim 8, wherein the first reference bi-state device and the second bi-state device are responsive to a logic state that depends at least upon an output of the multi bit quantizer.

10. The sigma-delta converter of claim 7, wherein the second switched capacitor circuit comprises a first bi-state device and a serially-coupled second bi-state device that are coupled to an input capacitor.

11. A sigma-delta converter, comprising:
a first summation circuit configured to receive an input voltage and an analog feedback voltage from a single bit digital-to-analog converter (DAC) configured to generate an output based upon a difference between the input voltage and the analog feedback voltage;
a filter coupled to the first summation circuit and having a plurality of serially-coupled integrator stages having respective outputs; and
a second summation circuit that sums the outputs from the integrator stages to provide a summed value to a quantizer coupled to the second summation circuit and to receive a feed forward value generated in response to an output from the second summation circuit.

12. The sigma-delta converter of claim 11, wherein the feed forward value is approximately equal to a reciprocal of a product of gain of the quantizer and gain of the DAC.

13. A sigma-delta converter, comprising:
a first summation circuit configured to receive an input voltage and an analog feedback voltage from a single bit digital-to-analog converter (DAC) configured to generate an output based upon a difference between the input voltage and the analog feedback voltage;
a filter coupled to the first summation circuit and having a plurality of serially-coupled integrator stages having respective outputs;
a second summation circuit that sums the outputs from the integrator stages to provide a summed value to a quantizer coupled to the second summation circuit and to receive a feed forward value generated in response to an output from the second summation circuit; and
wherein the quantizer and the DAC are configured to respond to a clock signal having a frequency that is higher than a frequency of a clock signal received by the filter.

14. The sigma-delta converter of claim 13, comprising a decimation filter coupled to the output of the quantizer, wherein the decimation filter and the single bit digital-to-analog converter (DAC) are configured to receive a most significant bit output from the quantizer.

15. The sigma-delta converter of claim 13, wherein the multi bit quantizer comprises a flash analog-to-digital converter.

16. The sigma-delta converter of claim 13, wherein the feed forward value varies as a linear function of a gain control signal.

17. The sigma-delta converter of claim 13, comprising a feed forward path to communicate the fed forward value, and a statistical filter coupled to the quantizer and the feed forward path.

18. The sigma-delta converter of claim 17, wherein the statistical filter includes a Weiner filter.

19. An electronic system, comprising:
a sigma-delta converter, further comprising:
a filter coupled to a first summation circuit at an input, and a second summation circuit at an output;
a multi-bit quantizer coupled to the second summation circuit and operable to generate a multi-bit output;
a single bit digital-to-analog converter (DAC) defining a feedback path between the multi-bit quantizer and the first summation circuit;
a feed-forward coefficient circuit defining a feed forward path between the first summation circuit and the second summation circuit, the feed-forward coefficient circuit operable to multiply an input voltage supplied to the first summation circuit times a coefficient and to supply the product of the input voltage times the coefficient to the second summation circuit, and the feed-forward coefficient circuit operable to utilize the multi-bit output from the multi-bit quantizer to generate a value for the coefficient;
at least one input device;
at least one output device; and
at least one storage device.

20. The electronic system of claim 19, wherein the feed-forward coefficient circuit is configured to generate a feed forward value by multiplying an input voltage by a selected feed forward coefficient that is a function of a gain control input signal.

21. The electronic system of claim 19, wherein the second summation circuit comprises a plurality of switched capacitor circuits configured to receive input voltages from the filter and coupled to an operational amplifier having a feedback network coupled to an output of the plurality of switched capacitor circuits.

22. The electronic system of claim 21, wherein the plurality of switched capacitor circuits each includes a first bi-state device serially coupled to a capacitor and configured to receive the input voltage, and a second bi-state device coupled to the first bi-state device and the capacitor, and coupled to a ground potential.

23. The electronic system of claim 22, wherein the first bi-state device is configurable in a high logic state and a low logic state, and the second bi-state device is configurable in a high logic state and a low logic state, such that when the first bi-state device is configured in the high logic state, the second bi-state device is configured in the low logic state, and when the second bi-state device is configured in the high logic state, the first bi-state device is configured in the low logic state.

24. The electronic system of claim 21, wherein the feedback network comprises a feedback capacitor coupled in parallel with a feedback bi-state device.

25. The electronic system of claim 24, wherein the feedback bi-state device is configurable in a high logic state and a low logic state.

26. The electronic system of claim 19, wherein the first summation circuit comprises a first switched capacitor circuit and a second switched capacitor circuit coupled to an operational amplifier having a feedback capacitor.

27. The electronic system of claim 26, wherein the first switched capacitor circuit comprises a first reference bi-state device and a second bi-state device coupled to a reference capacitor.

28. The electronic system of claim 27, wherein the first reference bi-state device and the second bi-state device are responsive to a logic state that depends at least upon an output of the multi bit quantizer.

29. The electronic system of claim 26, wherein the second switched capacitor circuit comprises a first bi-state device and a serially-coupled second bi-state device that are coupled to an input capacitor.

* * * * *